(12) United States Patent
Chen et al.

(10) Patent No.: US 11,148,942 B2
(45) Date of Patent: Oct. 19, 2021

(54) THREE-DIMENSIONAL FEATURES FORMED IN MOLDED PANEL

(71) Applicant: Hewlett-Packard Development Company, L.P., Houston, TX (US)

(72) Inventors: Chien-Hua Chen, Corvallis, OR (US); Devin A. Mourey, Corvallis, OR (US); Michael G. Groh, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 632 days.

(21) Appl. No.: 15/761,192

(22) PCT Filed: Nov. 5, 2015

(86) PCT No.: PCT/US2015/059180
§ 371 (c)(1),
(2) Date: Mar. 19, 2018

(87) PCT Pub. No.: WO2017/078716
PCT Pub. Date: May 11, 2017

(65) Prior Publication Data
US 2018/0265353 A1    Sep. 20, 2018

(51) Int. Cl.
*B41J 2/16*     (2006.01)
*B81C 99/00*    (2010.01)
(Continued)

(52) U.S. Cl.
CPC .......... *B81C 99/008* (2013.01); *B01L 3/0268* (2013.01); *B41J 2/155* (2013.01); *B41J 2/1603* (2013.01); *B41J 2/1637* (2013.01); *B81C 1/00309* (2013.01); *B41J 2202/19* (2013.01); *B41J 2202/20* (2013.01);
(Continued)

(58) Field of Classification Search
CPC . B81C 99/008; B81C 1/00309; B01L 3/0268; B41J 2/155; B41J 2/1603; B41J 2/1637; B41J 2202/19; B41J 2202/21; B81B 2201/058; B81B 2201/052;
(Continued)

(56) References Cited

U.S. PATENT DOCUMENTS 5,443,713 A * 8/1995 Hindman ............. B41J 2/162
                                                  205/70
5,685,491 A   11/1997 Marks et al.
(Continued)

FOREIGN PATENT DOCUMENTS

DE   102010035606   3/2012
KR   10-200300120   2/2003
KR   101493051      2/2015

OTHER PUBLICATIONS

Zaveri, Jesal, "Electrical and Fluidic Interconnect Design and Technology for 3D ICS", May 2011, 92 pages, Georgia Institute of Technology.

*Primary Examiner* — Donghai D Nguyen
(74) *Attorney, Agent, or Firm* — Austin Rapp

(57) ABSTRACT

Examples include a device comprising integrated circuit dies molded into a molded panel. The molded panel has three-dimensional features formed therein, where the three-dimensional features are associated with the integrated circuit dies. To form the three-dimensional features, a feature formation material is deposited, the molded panel is formed, and the feature formation material is removed.

12 Claims, 15 Drawing Sheets

(51) Int. Cl.
*B81C 1/00* (2006.01)
*B41J 2/155* (2006.01)
*B01L 3/02* (2006.01)

(52) U.S. Cl.
CPC ..... *B41J 2202/21* (2013.01); *B81B 2201/052* (2013.01); *B81B 2201/058* (2013.01); *B81B 2203/0315* (2013.01); *B81B 2203/0338* (2013.01); *B81C 2201/0188* (2013.01); *B81C 2203/0154* (2013.01)

(58) Field of Classification Search
CPC ....... Y10T 29/491146; Y10T 29/49158; Y10T 29/49346; H04R 19/005
USPC ............................. 29/832, 871, 848, 890.1
See application file for complete search history.

(56) References Cited

U.S. PATENT DOCUMENTS

| | | | |
|---|---|---|---|
| 6,145,965 | A | 11/2000 | Inada et al. |
| 7,300,596 | B2* | 11/2007 | Murayama ............. B41J 2/1603 216/27 |
| 8,765,512 | B2* | 7/2014 | Kohl ..................... B81B 3/0018 438/51 |
| 9,708,174 | B2* | 7/2017 | Ziglioli ................ H04R 19/005 |
| 2004/0233254 | A1 | 11/2004 | Kim |
| 2006/0134561 | A1 | 6/2006 | Michel et al. |
| 2006/0204699 | A1 | 9/2006 | Maltezos et al. |
| 2007/0059531 | A1 | 3/2007 | Park et al. |
| 2009/0066765 | A1 | 3/2009 | Silverbrook |
| 2011/0175959 | A1 | 7/2011 | Van Brocklin et al. |
| 2011/0240473 | A1 | 10/2011 | Kulah et al. |
| 2012/0212540 | A1 | 8/2012 | Dietl |
| 2015/0202871 | A1 | 7/2015 | Cruz-Uribe et al. |

* cited by examiner

THREE-DIMENSIONAL FEATURES FORMED IN MOLDED PANEL

BACKGROUND

Microfabrication and micromachining processes may refer to processes in which micrometer scale or smaller devices and structures may be formed. For example, microelectromechanical systems corresponds to various microstructures which may be implemented in sensors or other devices. As another example, microfluidic devices, such as inkjet printheads, may correspond to devices of a micrometer or smaller scale that convey, dispense, and/or process small amounts (e.g., microliters) of fluid substances.

DRAWINGS

FIG. 1 is a top view of some components of an example device.

FIGS. 2A-B is a cross-sectional view of some components of an example device.

Figure 12A:
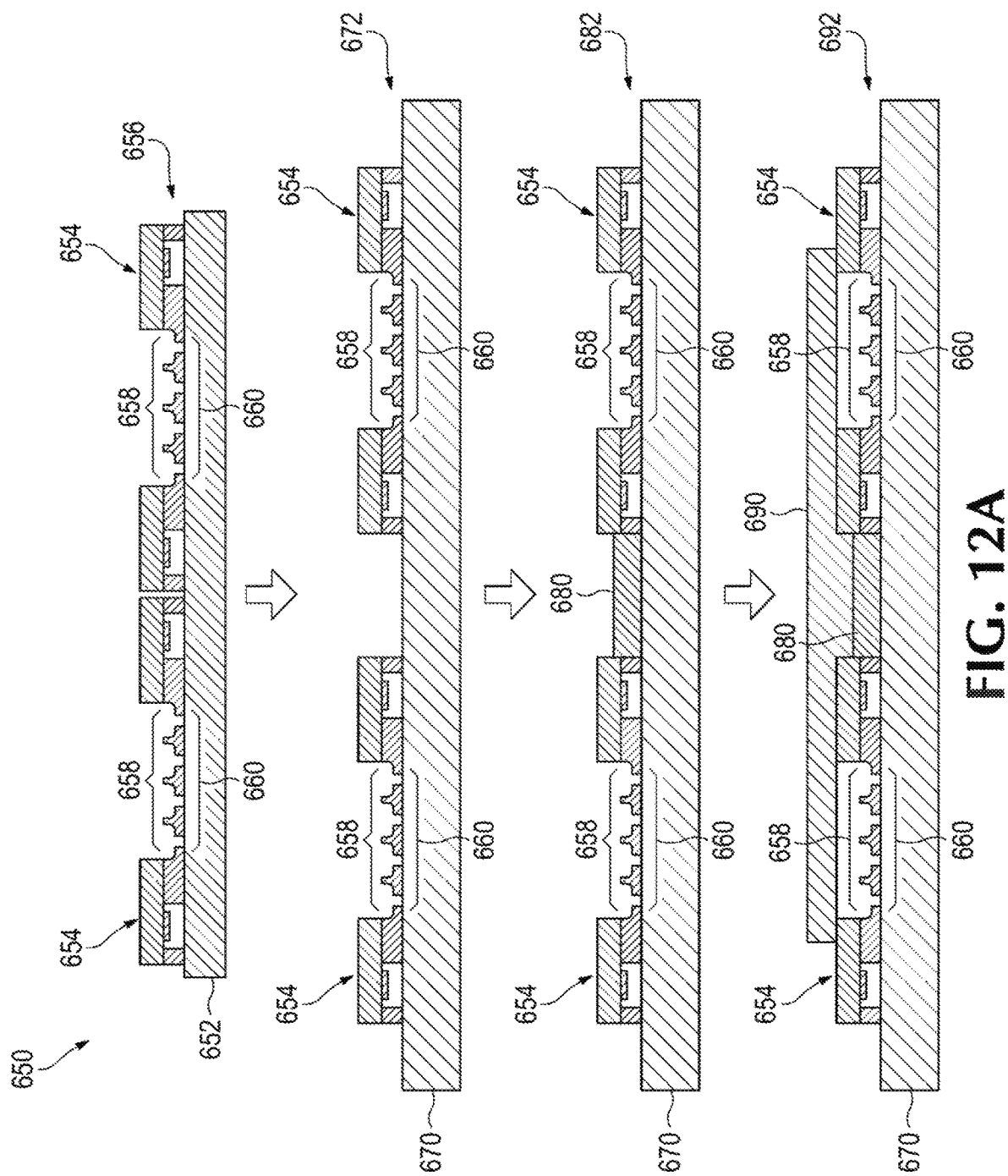
Figure 12B:
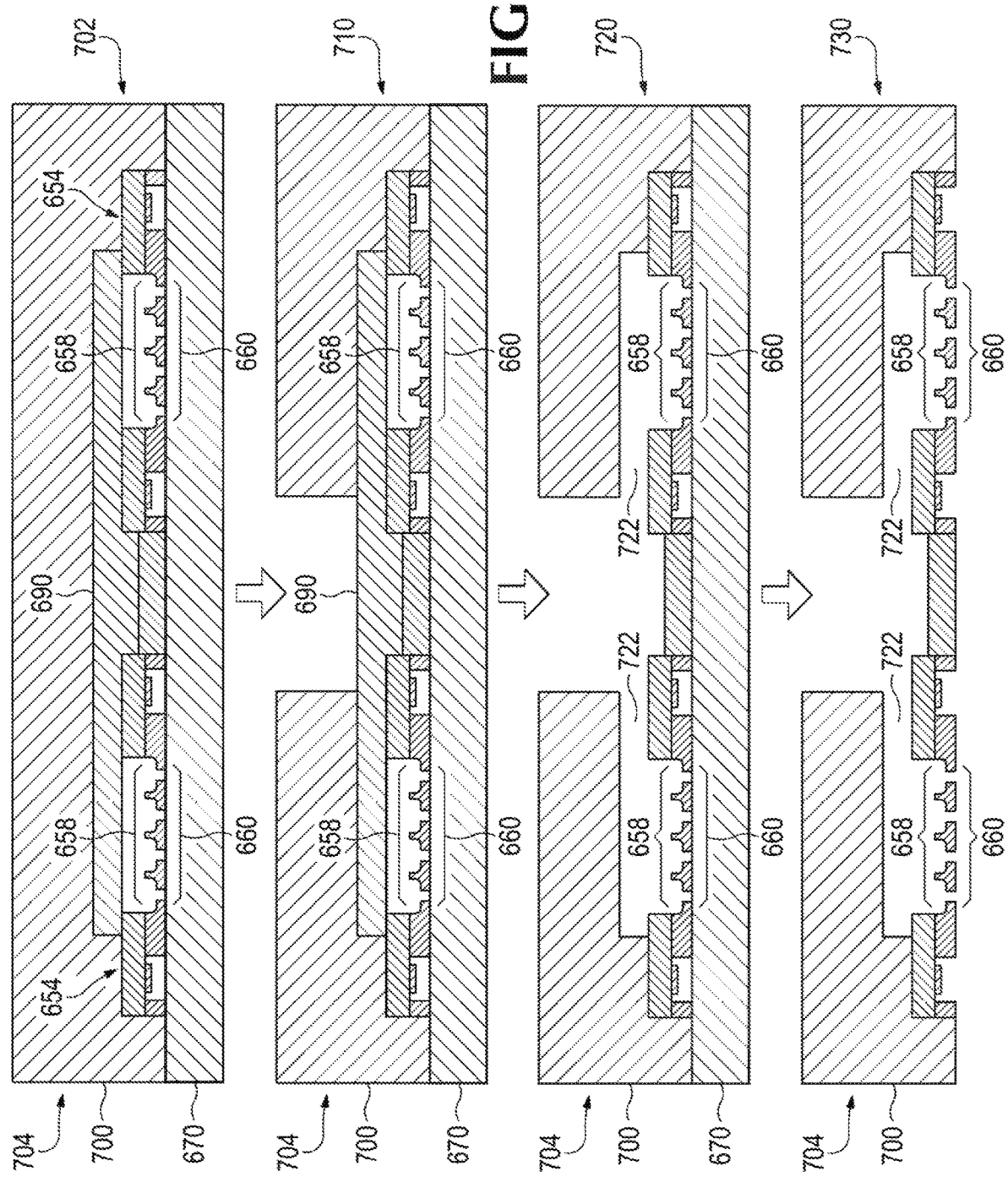

FIGS. 12A-B are flow diagrams of an example process to form an example device.

Figure 13:
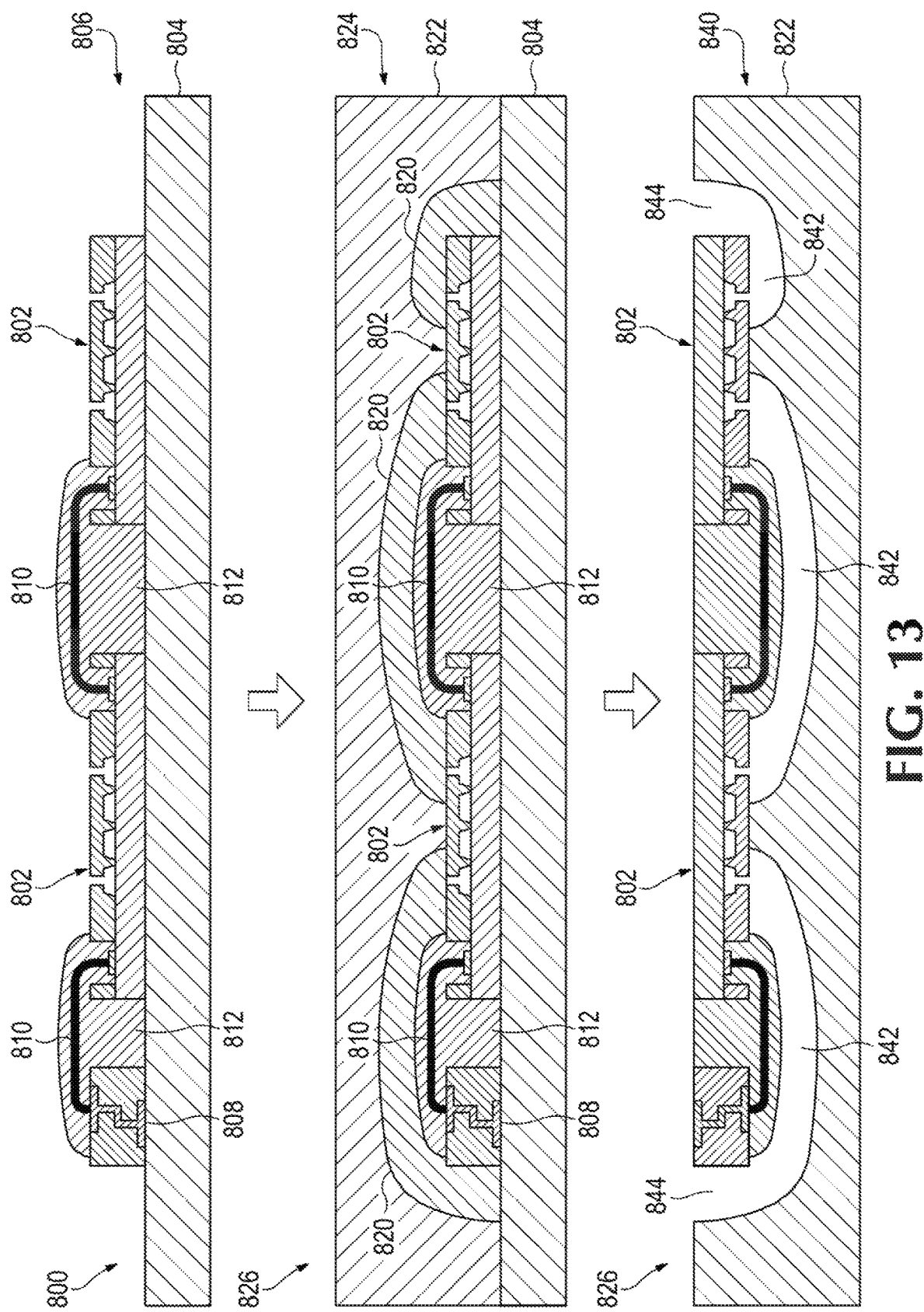

FIG. 13 is a flow diagram of an example process to form an example device.

Throughout the drawings, identical reference numbers designate similar, but not necessarily identical, elements. The figures are not necessarily to scale, and the size of some parts may be exaggerated to more clearly illustrate the example shown.

DESCRIPTION

Examples of devices may comprise fluid ejection devices, fluidic sensors, lab-on-a-chip (LOC) devices, integrated fluidic processing devices, microelectromechanical systems, and/or other such microfabricated devices. In such examples, an integrated circuit die may be molded into a panel, where the molded panel may have microstructures formed therein and associated with the integrated circuit die. The microstructures formed in the panel may be referred to as three-dimensional features, and the three-dimensional features may be formed in the molded panel by removal of a three-dimensional feature formation material deposited in the molded panel. In some examples, the three-dimensional feature formation material may be removed from the molded panel after the integrated circuit die is molded into the panel. As described herein, the molded panel may be referred to as simply a panel or a substrate. The molded panel may correspond to packaging for one or a plurality of integrated circuit (IC) dies for a device. In some examples, the integrated circuit dies may be a plurality of integrated circuit dies of the same type. For example, in an example printhead, the integrated circuit dies may be fluid ejection dies to eject printing material. In other examples, the integrated circuit dies may be of different types to perform different operations. For example, in a lab-on-a-chip device, a first integrated circuit die may comprise fluidic pumps and valves, a second integrated circuit die may comprise a fluidic reaction chamber, and a third integrated circuit die may comprise a fluid processing integrated circuit.

As described herein, the three-dimensional features may correspond to microstructures having a feature size of a micrometer or smaller scale. For example, if a three-dimensional feature is a fluid communication channel, the fluid communication channel may have a depth of approximately 100 to 200 µm and the fluid communication channel may have a width of approximately 100 to 2000 µm. In some examples, a three-dimensional feature may have a feature size of approximately 10 µm to 3000 µm. As will be appreciated, three-dimensional features formed in a molded panel may refer to three-dimensional features formed on a surface of the molded panel, as well as three-dimensional features at least partially enclosed by the molded panel. For example, a three-dimensional feature may be a fluid communication channel formed through a molded panel. As another example, a three-dimensional feature may be a fluid communication channel formed as a trench in the surface of the molded panel.

In some examples, an integrated circuit die may be a fluid ejection die, and the fluid ejection die may be molded into a molded panel. In these examples, the molded panel may have three-dimensional features that are fluid communication channels formed in the panel. In these examples, fluid may be conveyed through such fluid communication channels to the fluid ejection die. In some examples, a fluid ejection device may be a printhead, where the printhead may comprise a plurality of fluid ejection dies molded into a molded panel that dispense printing material. Printing material, as used herein, may comprise ink, toner, fluids, powders, colorants, varnishes, finishes, gloss enhancers, binders, and/or other such materials that may be utilized in a printing process. In some examples corresponding to printheads, a width of the molded panel may correspond to a printing width of printing devices in which the printhead may be implemented.

In some examples corresponding to printheads, fluid ejection dies may be generally arranged end-to-end along a width of the molded panel such that a printing device implementing the printhead may perform a page-wide printing process. In other example fluid ejection devices, a single fluid ejection die may be molded into the molded panel. In some examples, fluid ejection dies may be referred to as slivers. In addition, the fluid ejection dies may be formed with silicon or a silicon-based material. Various features, such as nozzles, may be formed from various materials used in silicon device based fabrication, such as silicon dioxide, silicon nitride, metals, epoxy, polyimide, other carbon-based materials, etc. As described herein, a sliver may correspond to a fluid ejection die having: a thickness of approximately 650 µm or less; exterior dimensions of approximately 30 mm or less; and/or a length to width ratio of approximately 3 to 1 or larger.

Furthermore, some fluid ejection devices, as described herein, may be implemented in printing devices, such as two-dimensional printers and/or three-dimensional printers (3D). In some examples, a fluid ejection device may be implemented into a printing device and may be utilized to print content onto a media, such as paper, a layer of powder-based build material, reactive devices (such as labon-a-chip devices), etc. Example fluid ejection devices include ink-based ejection devices, digital titration devices, 3D printing devices, pharmaceutical dispensing devices, lab-on-chip devices, fluidic diagnostic circuits, and/or other such devices in which amounts of fluids may be dispensed/ ejected. In some examples, a printing device in which a fluid ejection device may be implemented may print content by deposition of consumable fluids in a layer-wise additive manufacturing process. Generally, consumable fluids and/or consumable materials may include all materials and/or compounds used, including, for example, ink, toner, fluids or powders, or other raw material for printing. Generally, printing material, as described herein may comprise consumable fluids as well as other consumable materials. Printing material may comprise ink, toner, fluids, powders, colorants, varnishes, finishes, gloss enhancers, binders, and/ or other such materials that may be utilized in a printing process.

Some example devices may correspond to sensor devices. Furthermore, examples may comprise integrated circuit dies for analyzing/processing various fluids, and in these examples, the molded panel may have fluid communication channels formed therein, where the fluid communication channels may facilitate conveyance of fluid to a sensor surface of the integrated circuit die. For example, a device may correspond to a point-of-care lab-on-a-chip device. In this example, the device may comprise an integrated circuit die that is a chemical sensor, an integrated circuit die that is a microfluidic pump, an integrated circuit die that is a microfluidic processing device, and/or an integrated circuit die that is a microfluidic reaction device.

In some examples, the molded panel may comprise an epoxy mold compound, such as CEL400ZHF40WG from Hitachi Chemical, Inc., and/or other such materials. Furthermore, the feature formation material may comprise a plastic-based material (e.g., thermoplastic), a metal based material, an alloy, an acrylic-based material, HT10.10 from Brewer Science, Inc., thermal decomposable polymers from Novomer, Inc., and/or other such materials. For example, the feature formation material may be a temporary bonding material used in microelectronic thin wafer processing. As a particular example, the feature formation material may be a silica filled polymer material, such as a silica filled thermoplastic.

In addition, examples include processes for forming devices comprising a molded panel with three-dimensional features formed therein and integrated circuit dies molded in the molded panel. In such examples, a plurality of integrated circuit dies may be arranged on a carrier and a feature formation material is deposited in a desired pattern that corresponds to three-dimensional features to be formed. A molded panel is formed that includes the integrated circuit dies and the feature formation material. After forming the panel, the feature formation material may be removed. In some examples, removal of the feature formation material may thereby form the three-dimensional features. For example, removal of the feature formation material in the molded panel may form fluid communication channels through and in the molded panel.

In some examples, after molding fluid ejection dies in the molded panel, fluid communication channels that are aligned to and in fluid communication with fluid feed holes and nozzles of the fluid ejection dies may be formed through the molded panel. By molding the fluid ejection dies in the molded panel prior to forming of the fluid communication channels, examples facilitate alignment of the fluid ejection dies and the fluid communication channels. As used herein, such aligned fluid communication channels may be referred to as "self-aligned" fluid communication channels or simply aligned fluid communication channels. It will be appreciated that fluid communication channels described herein are aligned to the fluid ejection dies, the fluid feed holes of the fluid ejection dies, and the nozzles of the fluid ejection dies. Furthermore, forming the fluid communication channels after molding the fluid ejection dies into the molded panel facilitates removal of debris or manufacturing materials that may limit fluid communication between the fluid communication channels and the fluid feed holes and nozzles of the fluid ejection dies. Moreover, as will be appreciated, fluids, as used herein, may comprise substances that may deform (flow), where fluids may include liquids, gases, plasmas, and/or some plastic solids.

Figure 1:
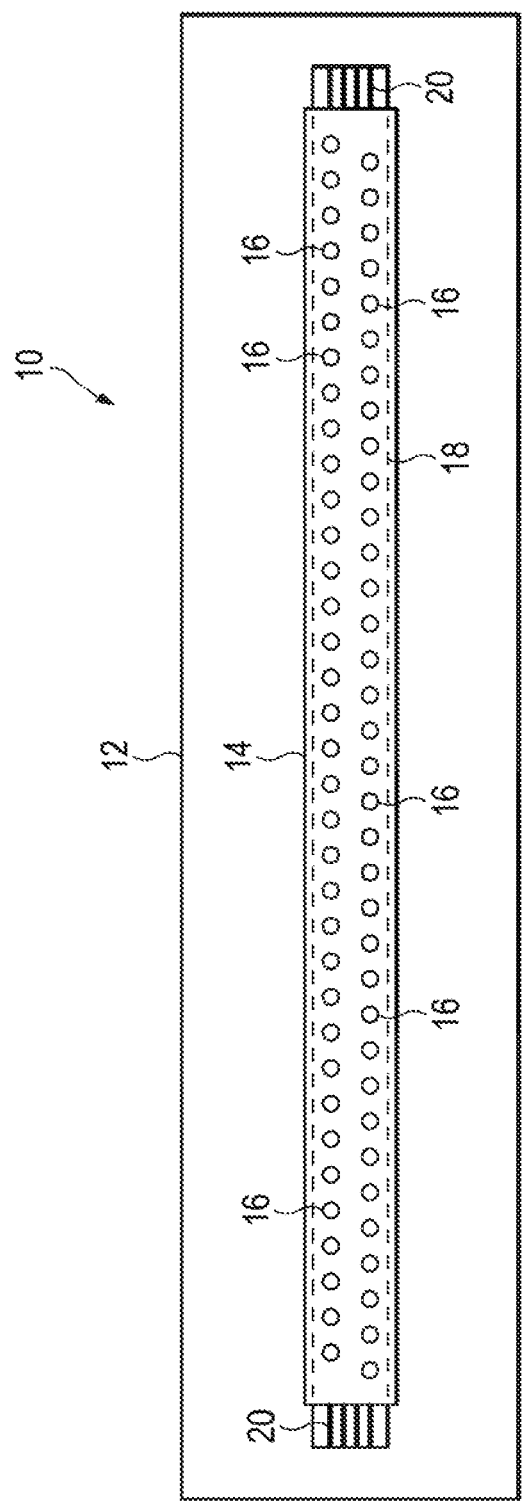

Turning now to the figures, and particularly, to FIG. 1, this figure illustrates some components of an example fluid ejection device 10. In this example, the fluid ejection device 10 comprises a molded panel 12 and a fluid ejection die 14 molded in the molded panel 12. While not shown in this example, it will be appreciated that more than one fluid ejection die may be molded into a molded panel in some examples. As shown, the fluid ejection die 14 comprises a plurality of nozzles 16 to dispense/eject fluid. In some examples, the fluid ejection die may dispense printing material via the nozzles 16. The fluid ejection die 14 may be molded into the molded panel 12 by an exposed die molding process (e.g., compression molding, transfer molding, etc.). A fluid communication channel 18 is illustrated with a dashed line, where the fluid communication channel 18 is formed in the molded panel 12 and is in fluid communication with the nozzles 16 such that printing material may be conveyed to the nozzles via the fluid communication channel 18.

Therefore, in this example, the three-dimensional features of the device are fluid communication channels. In this example, the fluid communication channel 18 may be at least partially formed by removal of a feature formation material deposited in the molded panel 12. In addition, the fluid communication channel 18 may be at least partially formed by other micromachining processes, such as slot plunge cutting of a portion of the molded panel 12. Furthermore, the example fluid ejection device 10 comprises conductive traces 20 electrically connected to the fluid ejection die 14. While not shown, the fluid ejection die 14 may comprise at least one fluid ejector proximate each nozzle 16 to selectively eject fluid from the respective nozzle 16. In general, the fluid ejectors may be controlled by a controller connected to the fluid ejection die 14 via the conductive traces 20. Moreover, since the fluid communication channel 18 is formed after molding the fluid ejection die 14 to the molded panel 12, the fluid communication channel is aligned to the fluid ejection die 14.

Figure 2A:
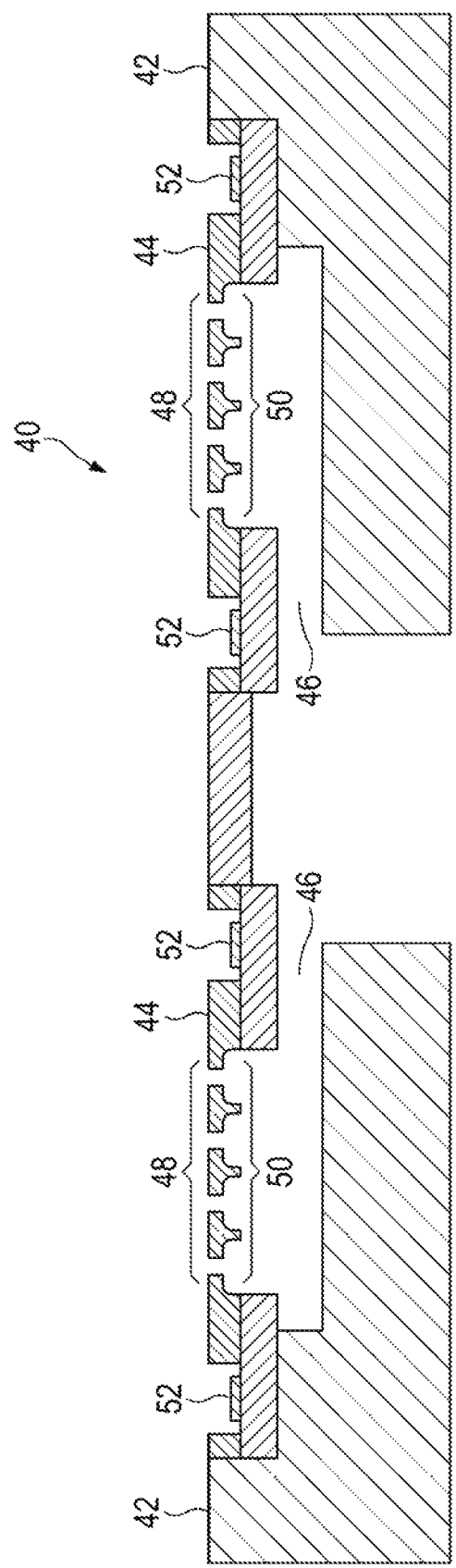

FIG. 2A provides a cross-sectional view of an example fluid ejection device 40. In this example, the fluid ejection device 40 comprises a molded panel 42 and fluid ejection dies 44 molded in the molded panel 42. The molded panel 42 has fluid communication channels 46 formed therein that are in fluid communication with the fluid ejection dies 44. Each fluid ejection die 44 comprises a plurality of nozzles 48 to eject fluid. As shown in this example, each fluid ejection die 44 comprises fluid feed holes 50 that fluidly connect the nozzles 48 and the fluid communication channels 46. While in this example, the fluid ejection device 40 is illustrated with two fluid ejection dies 44, it will be appreciated that other examples may include more fluid ejection dies or less fluid ejection dies. In addition, while in the example fluid ejection device 40, the fluid communication channels 46 are in fluid communication with two fluid ejection dies 44, it will be appreciated that in other examples fluid communication channels may be in fluid communication with one fluid ejection die each, or each fluid communication channel may be in fluid communication with more fluid ejection dies than the example of FIG. 2A. Furthermore, in this example, the fluid ejection dies 44 comprise electrical connection points 52 (which may be referred to as bond pads) to which conductive traces may be electrically connected.

Figure 2B:
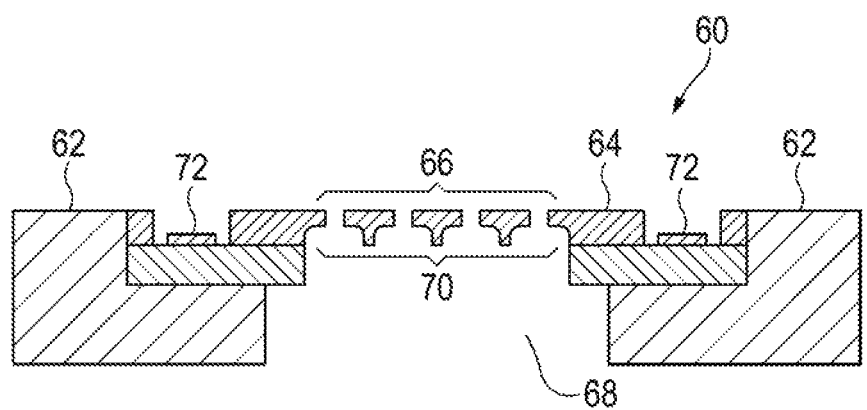

FIG. 2B provides a cross sectional view of an example fluid ejection device 60 comprising a molded panel 62 and a fluid ejection die 64 molded in the molded panel 62. In this example, the fluid ejection die comprises a plurality of nozzles 66 to selectively eject fluid. For example, the fluid ejection device 60 may be implemented in a printing system to selectively eject printing material to print content on a physical medium. In this example, a fluid communication channel 68 is formed through the molded panel 62, where the fluid communication channel 68 is in fluid communication with the nozzles 66 of the fluid ejection die 64 via fluid feed holes 70 that are formed in the fluid ejection die 64. In this example, at least a portion of the fluid communication channel 68 is formed by removal of a feature formation material. In some examples, removal of the feature formation material thereby fluidly connects the fluid feed holes 70 with the fluid communication channel 68. In this example, the fluid ejection die 64 further comprises electrical connection points 72 to which conductive traces may be electrically connected. As will be appreciated, the conductive traces may facilitate connection of the fluid ejection device 60 to a controller with which to control ejection of fluid from the nozzles 66.

Figure 3:
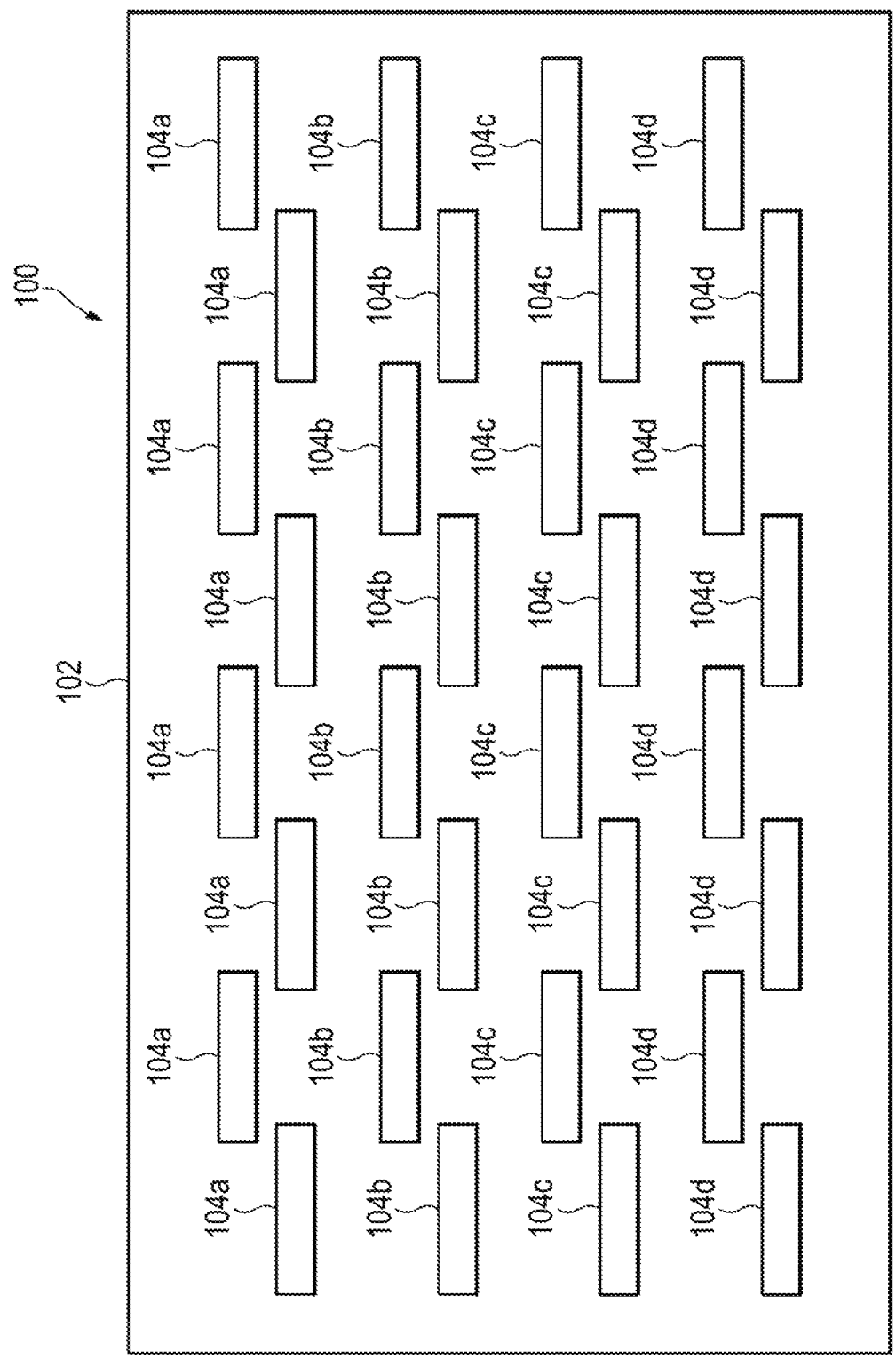
FIG. 3 is top view of some components of an example device.

FIG. 3 is a top view of an example fluid ejection device 100. In this example, the fluid ejection device 100 comprises a molded panel 102 and a plurality of fluid ejection dies 104a-d molded in the molded panel 102. As shown, the fluid ejection dies 104a-d are generally arranged end-to-end along a width of the molded panel 102. In some examples, the fluid ejection device 100 may be implemented in a page-wide, fixed printhead, printing device. In such examples, the fluid ejection dies 104a-d may be arranged generally end-to-end along the width of the fluid ejection device 100 and molded panel 102, where the width of the fluid ejection device 100 corresponds to a printing width of a printing device into which the fluid ejection device 100 may be implemented.

Furthermore, in some examples, such as the example shown in FIG. 3, the fluid ejection dies 104a-d may be arranged in sets that correspond to a printing order. For example, a first set of fluid ejection dies 104a may correspond to a first printing order, a second set of fluid ejection dies 104b may correspond to a second printing order; a third set of fluid ejection dies 104c may correspond to a third printing order; and a fourth set of fluid ejection dies 104d may correspond to a fourth printing order. In some examples, a printing order may correspond to an order in which a color of a printing material and/or a type of printing material is dispensed onto a physical medium during a printing process. For example, in a cyan, magenta, yellow, and black (CMYK) color printing process: a black color printing material may have a first printing order; a cyan printing material may have a second printing order; a magenta color printing material may have a third printing order; and a yellow color printing material may have a fourth printing order. To illustrate by way of example, if the example fluid ejection device 100 of FIG. 3 were implemented in a CMYK printing device/process, the first set of fluid ejection dies 104a may dispense a black color printing material; the second set of fluid ejection dies 104b may dispense a cyan color printing material; the third set of fluid ejection dies 104c may dispense a magenta color printing material; and the fourth set of fluid ejection dies 104d may dispense a yellow color printing material.

While the example of fluid ejection device 100 is illustrated with four sets of fluid ejection dies 104a-d, other examples may comprise various arrangements of fluid ejection dies based on the printing processes and printing devices into which the examples may be implemented. Moreover, while examples have been described with regard to dispensation of colorant printing materials, other examples may dispense other types of printing materials, such as binders, gloss enhancers, varnishes, etc.

Figure 4:
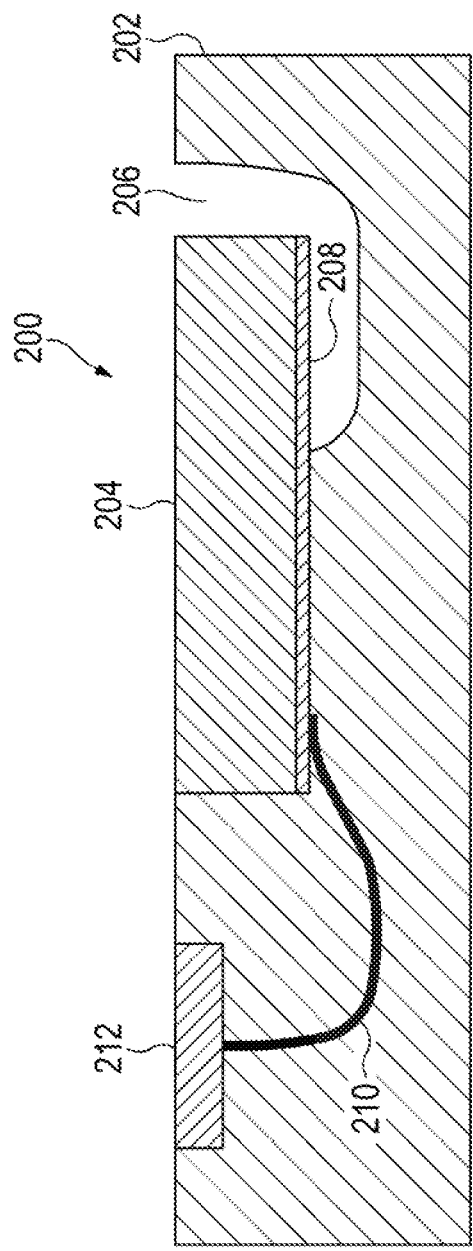
FIG. 4 is a cross-sectional view of an example device.

FIG. 4 provides a cross-sectional view of some components of an example device 200. In this example, the device 200 includes a molded panel 202 and an integrated circuit die 204 molded in the molded panel 202. As shown, the molded panel 202 has a three-dimensional feature 206 formed therein, which, in this example corresponds to a fluid communication channel. The integrated circuit die 204 may correspond to a sensor-type integrated circuit die that includes a sensing surface 208. The sensing surface 208 is to facilitate detection of a particular element/compound or a plurality of types of elements/compounds. In this example, the three-dimensional feature 206 facilitates communication of a fluid to the sensing surface 208. As shown in this example, the device 200 comprises a conductive trace 210 electrically connected to the integrated circuit die 204 at a first location of the conductive trace 210. As shown, the conductive trace 210 is at least partially enclosed in the molded panel 202 such that the material of the molded panel 202 electrically insulates the at least a portion of the conductive trace 210. The conductive trace 210 is connected, at a second end, to an electrical connection point 212 (which may be referred to as a bond pad). As will be appreciated, the integrated circuit die 204 of the device 200 may be electrically connected to a controller or other data processing device via the electrical connection point 212.

As will be appreciated, the example device 200 of FIG. 4 may be utilized in sample analysis and/or detection. In such examples, the three-dimensional feature 206 formed in the molded panel 202 facilitates fluid communication of a fluid to the sensing surface 208 of the integrated circuit die 204. A controller connected to the integrated circuit die 204 via the electrical connection point 212 and conductive trace may analyze a sample based on characteristics of the sensing surface 208 determined via the electrical connection thereto.

Figure 5:
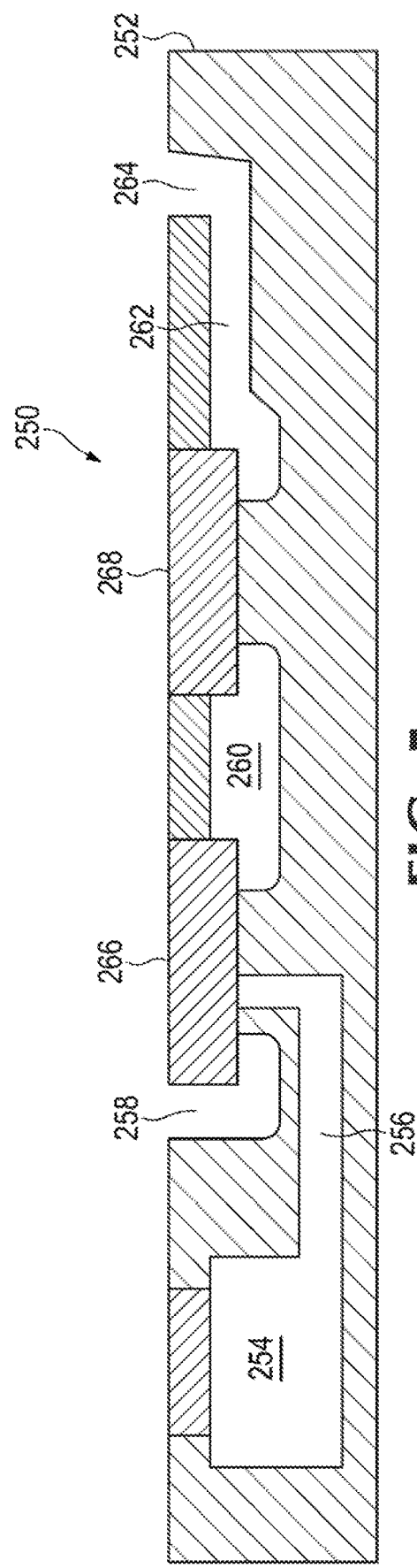
FIG. 5 is a cross-sectional view of some components of an example device.

FIG. 5 is a cross-sectional view of some components of an example device 250. In this example, the device 250 comprises a molded panel 252 having three-dimensional features 254-264 formed therein. In addition, the device 250 comprises integrated circuit dies 266-268 molded in the molded panel 252. In this example, a first integrated circuit die 266 may comprise pumps and/or valves, and a second integrated circuit die may comprise a reaction chip and/or a fluid processing chip. As shown, a first three-dimensional feature formed in the molded panel 252 may be a chamber or reservoir 254 that is fluidly connected to the first integrated circuit die 266 via a fluid communication channel 256 formed in the molded panel 252. In some examples, the reservoir 254 may be for storing a reagent for chemical analysis of a sample. A second three-dimensional feature in this example is a sample inlet 258 that is also in fluid communication with the first integrated circuit die 266.

A third three-dimensional feature is a fluid communication channel 260 that fluidly connects an output of the first integrated circuit die 266 and an input of the second integrated circuit die 268. As discussed, the second integrated circuit die 268 may comprise a fluid processing integrated circuit and/or a fluidic reaction integrated circuit. For example, the second integrated circuit die 268 may comprise a polymerase chain reaction integrated circuit. As another example, the second integrated circuit die 268 may comprise a fluidic separator integrated circuit and/or a fluidic detection integrated circuit. As shown, the second integrated circuit die 268 may fluidly connect to a fourth three-dimensional feature, which in this example is an outlet 264. As will be appreciated, a fluidic sample may be analyzed with the example device 250. Accordingly, examples similar to the example device 250 may be implemented in lab-on-a-chip packages, point of care integrated solutions, etc.

Figure 6:
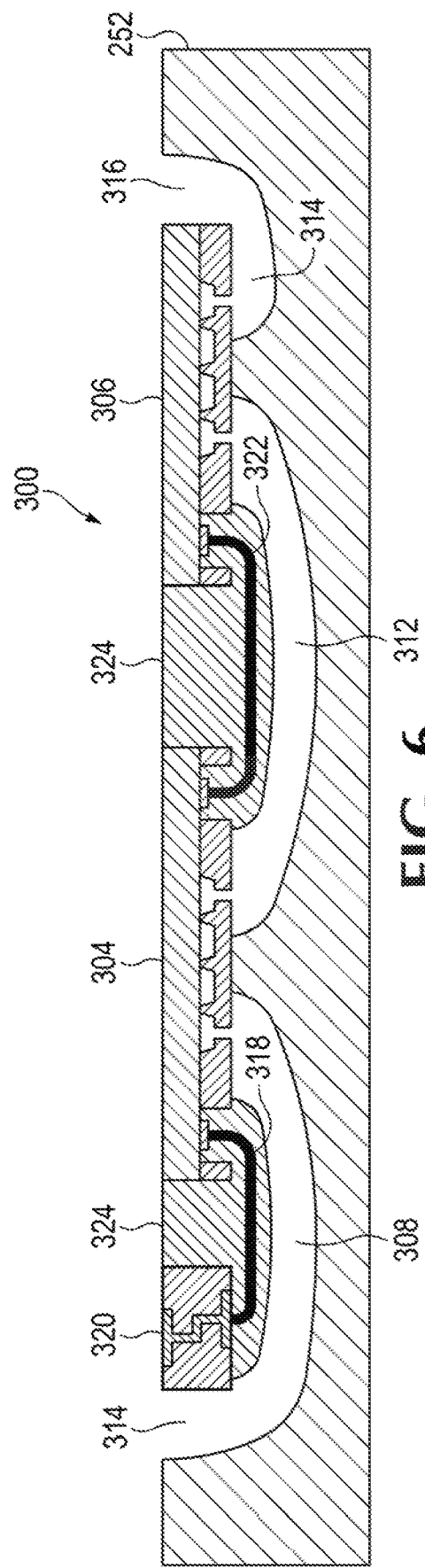
FIG. 6 is a cross-sectional view of some components of an example device.

FIG. 6 provides a cross-sectional view of some components of an example device 300. In this example, the device 300 comprises a molded panel 302. Furthermore, the device 300 comprises a first integrated circuit die 304 and a second integrated circuit die 306 molded into the molded panel 302. In addition, the molded panel 302 has three-dimensional features formed therein and associated with the integrated circuit dies 304-306. In this example, a first fluid communication channel 308 fluidly connects the first integrated circuit die 304 to a fluid inlet 314 formed on a surface of the device 300. A second fluid communication channel 312 fluidly connects the first integrated circuit die 304 and the second integrated circuit die 306. A third fluid communication channel 314 fluidly connects the second integrated circuit die 306 with a fluid outlet 316.

In this example, a first conductive trace 318 electrically connects the first integrated circuit die 304 to an electrical contact point 320 positioned on a surface of the device 300. A second conductive trace 322 electrically connects the first integrated circuit die 304 and the second integrated circuit die 306. As will be appreciated, the electrical contact point 320 may facilitate electrical connection to a controller or other data processing device such that data may be input/output to the integrated circuit dies 304-306. Furthermore, the conductive traces 318, 322 may be at least partially encapsulated with an insulating material 324 that may electrically insulate the conductive traces 318, 322 as well as protect the conductive traces 318, 322 from environmental conditions and/or fluids conveyed in the fluid communication channels 308, 312.

Figure 7:
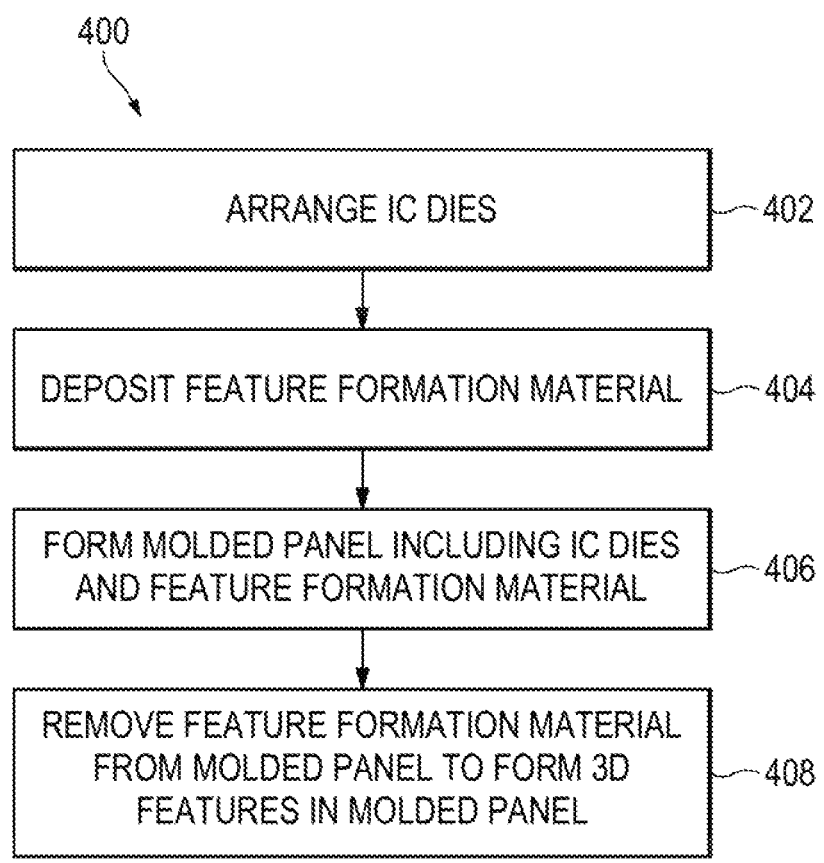
FIG. 7 is a flowchart of an example process.

FIG. 7 provides a flowchart that illustrates an example process 400 that may be performed to form a device. In this example, integrated circuit dies may be arranged (block 402). As will be appreciated, the arrangement of integrated circuit dies may be based at least in part on the device into which the integrated circuit dies are to be implemented. For example, for a printhead, the integrated circuit dies may be arranged generally end-to-end along a width of the printhead. As another example, for a sensor device, a set of integrated circuit dies may be arranged in positions associated with the function of the integrated circuit die in the sensor device. In some examples, the integrated circuit dies may be arranged on a carrier, such as a carrier used in microfabrication processes. In some examples, the integrated circuit dies may be removably/temporarily coupled to a carrier with relative positions therebetween based on the application for which the integrated circuit dies are to be implemented.

Feature formation material is deposited (block 404). In some examples, feature formation material is deposited to correspond to three dimensional features to be formed. For example, feature formation material may be deposited on a portion of an integrated circuit die and/or a carrier to facilitate forming of a fluid communication channel associated with the integrated circuit die. In some examples, feature formation material may be deposited by dispensing the feature formation material via a precision dispensing nozzle (e.g., a stainless steel needle TS20SS-1/2PK from Techcon System, Inc.). In other examples, feature formation material may be deposited by dispensing feature formation material with a fluid ejection device. In some examples, feature formation material may be dispensed by spraying the feature formation material from one or more nozzles as a fluid. In some examples, dispensing the feature formation material may comprise screen printing the feature formation material.

A molded panel is formed that includes the integrated circuit dies and the deposited feature formation material (block 406). In some examples, a molded panel is formed by performing an exposed die molding process such as compression molding, transfer molding, or other similar processes. As discussed, the molded panel is formed to include the integrated circuit dies and the feature formation material. The feature formation material is removed from the molded panel to form three-dimensional features in the molded panel (block 408).

Figure 8:
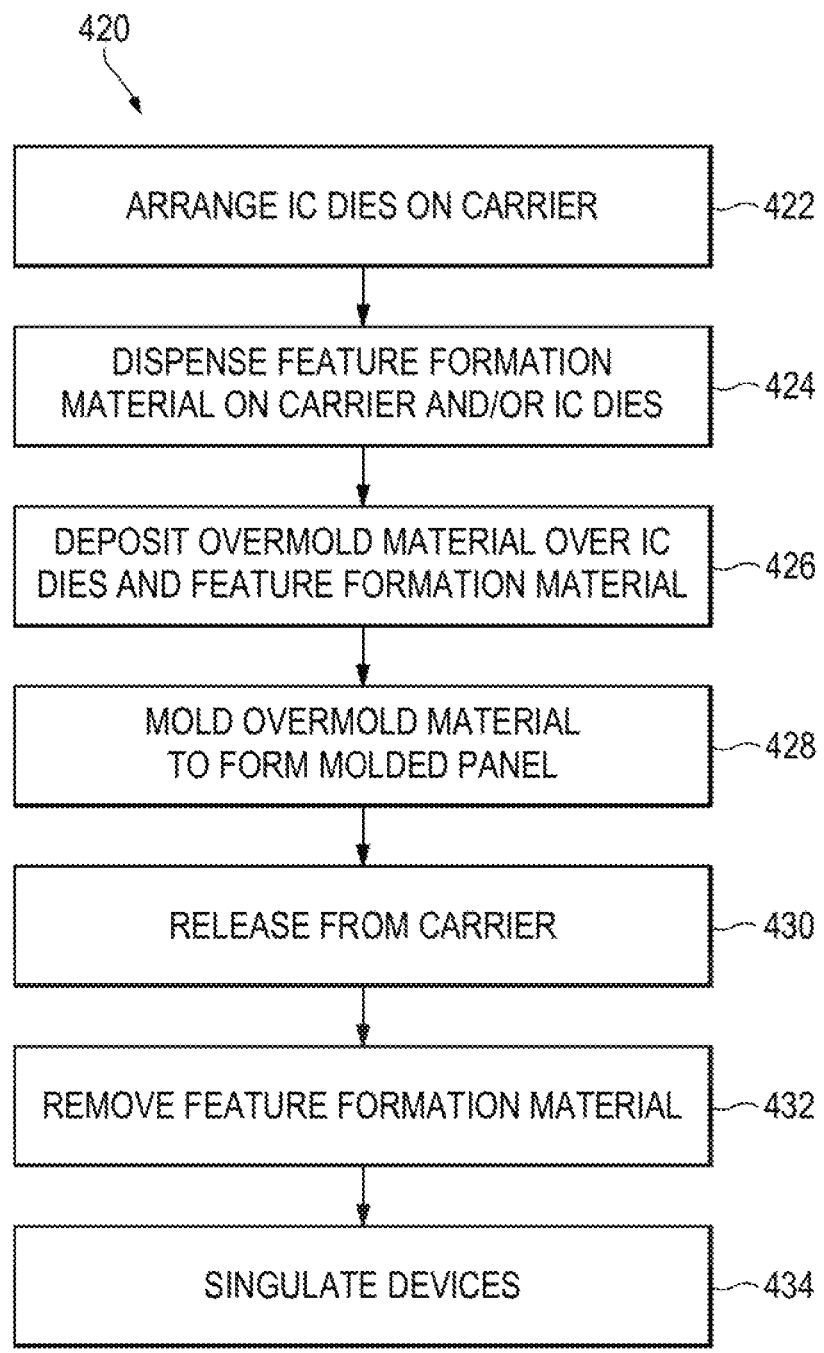
FIG. 8 is a flowchart of an example process.

FIG. 8 is a flowchart that illustrates an example process 420 that may be performed to fabricate example devices. In this example, integrated circuit dies are arranged on a carrier (block 422). In some examples, arranging integrated circuit dies on the carrier may comprise temporarily bonding the integrated circuit dies to the carrier using a temporary bonding material. Feature formation material is dispensed at least partially on the carrier and/or integrated circuit dies (block 424). In some examples, the feature formation material may be a temporary bonding material used in microfabrication. An overmold material is deposited over the integrated circuit dies and feature formation material on the carrier (block 426). The overmold material is molded to form a molded panel (block 428), where the molded panel includes the feature formation material and the integrated circuit dies. In some examples molding the overmold material may comprise compression molding the overmold material. In other examples, molding the overmold material may comprise transfer molding. As will be appreciated, molding the overmold material may comprise other exposed die molding processes.

After forming the molded panel, the molded panel may be released from the carrier (block 430). As discussed, the integrated circuit dies that are included in the panel may be temporarily bonded to the carrier. Accordingly, in some examples, releasing the carrier may include removing the temporary bond between the integrated circuit dies and the carrier. In some examples, releasing the panel from the carrier may comprise adjusting a temperature. In other examples, releasing the panel from the carrier may comprise emitting an ultraviolet light to cure a temporary adhesive that facilitates the temporary bond between the integrated circuit dies and the carrier. The feature formation material may be removed from the molded panel (block 432). In some examples, removing the feature formation material may comprise wet dipping in feature formation material remover. For example, if the feature formation material is HT10.10, the molded panel may be wet dipped in Wafer-Bond remover from Brewer Science, Inc. In some examples, a plurality of devices may be fabricated with one molded panel. In such examples, the devices may be singulated (block 434). Singulating the devices may comprise dicing the molded panel, cutting the molded panel, and/or other such known singulation processes.

Figure 9:
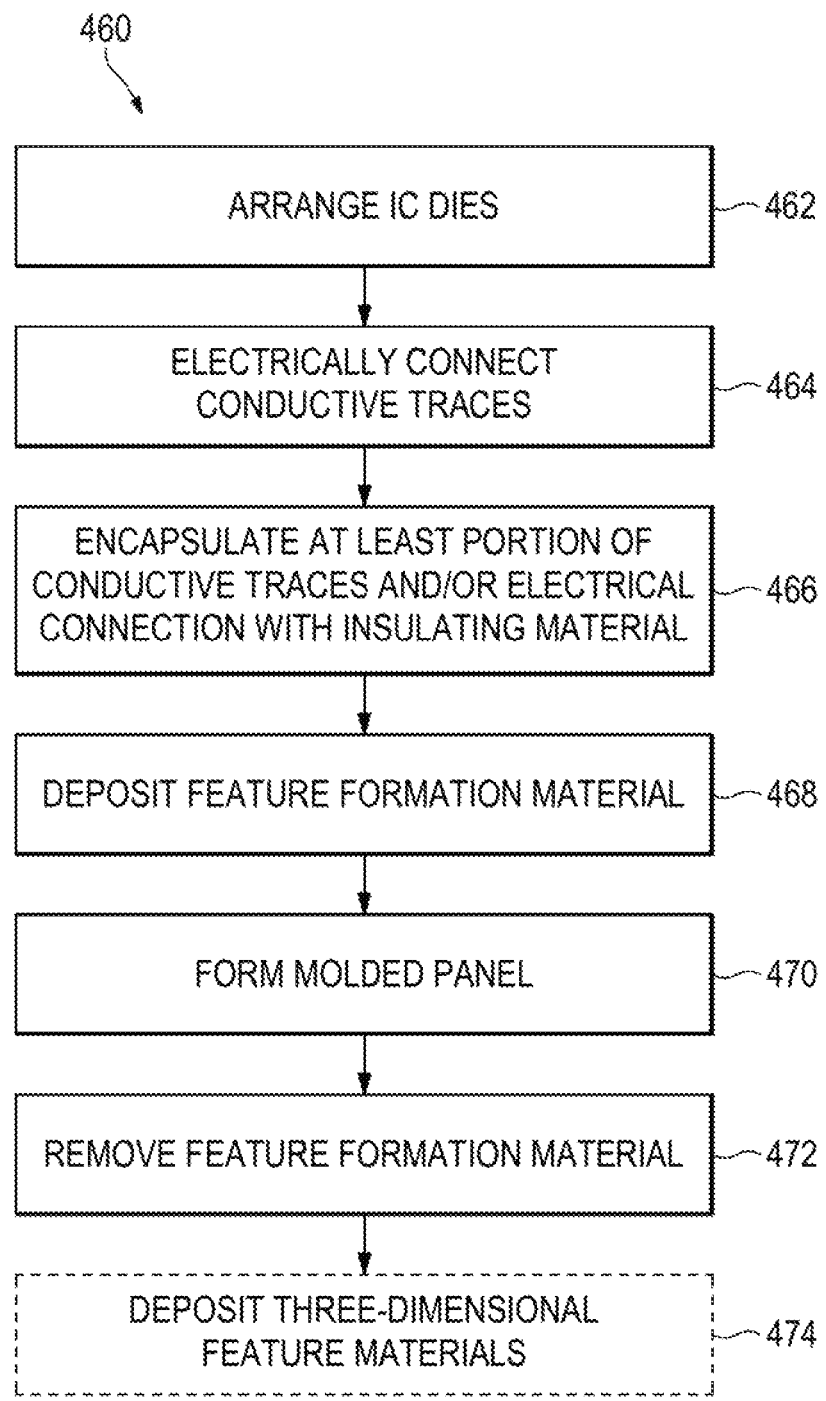
FIG. 9 is a flowchart of an example process.

FIG. 9 provides a flowchart that illustrates an example process 460 that may be performed to fabricate example devices. In this example, integrated circuit dies may be arranged (block 462). As discussed, based on application of the device, various types of integrated circuit dies may be arranged accordingly. For example, if the device is a fluid ejection device that may be implemented as a printhead, the integrated circuit dies may be arranged generally end-to-end along a width associated with a printing width in which the printhead may be implemented. As another example, if the device is a fluidic sensor device, a first integrated circuit die comprising fluidic pumps and/or valves may be positioned proximate a second integrated circuit die comprising a fluidic reaction chamber and a fluidic sensor.

In this example, conductive traces are electrically connected to the integrated circuit dies (block 464). As will be appreciated, conductive traces may comprise various types of materials that conduct electricity, such as metal-based wire. At least a portion of the conductive traces and/or the electrical connections between the conductive traces and the integrated circuit dies are encapsulated with an insulating material (block 466). In some examples, the insulating material is applied to cover bond pads of the integrated circuit dies and the conductive traces connected thereto. In some examples, encapsulating the at least a portion of the conductive traces and/or portions of the electrical connections may comprise encapsulating with Henkel FP1530, which may be cured at 160° C. for 7 minutes.

Feature formation material is deposited (block 468), where the feature formation material is deposited in a layout that corresponds to three-dimensional features to be formed in the molded panel. For example, if the three-dimensional features correspond to fluid communication channels, the feature formation material is deposited in a layout corresponding to the layout of the fluid communication channels in the device. As another example, if the three-dimensional features correspond to embedded structures in the molded panel that are formed of a different material than the molded panel, the feature formation material is deposited in a layout corresponding to the embedded structures.

A molded panel is formed (block 470) that includes the integrated circuit dies and the feature formation material. After forming the molded panel, the feature formation material is removed (block 472). As will be appreciated, in some examples, three-dimensional features may be formed in the molded panel by removal of the feature formation material such that openings, chambers, and/or channels may be formed in the molded panel. In other examples, after removing the feature formation material, a three-dimensional feature material may be deposited (block 474) in the chambers, openings, and/or channels formed by removal of the feature formation material. As will be appreciated, in such examples, the three-dimensional feature material may correspond to a material that is different than the materials of the molded panel. Accordingly, in such examples, example devices may comprise three-dimensional features formed/embedded in the devices comprised of materials differing from the materials of the molded panel.

Figure 10:
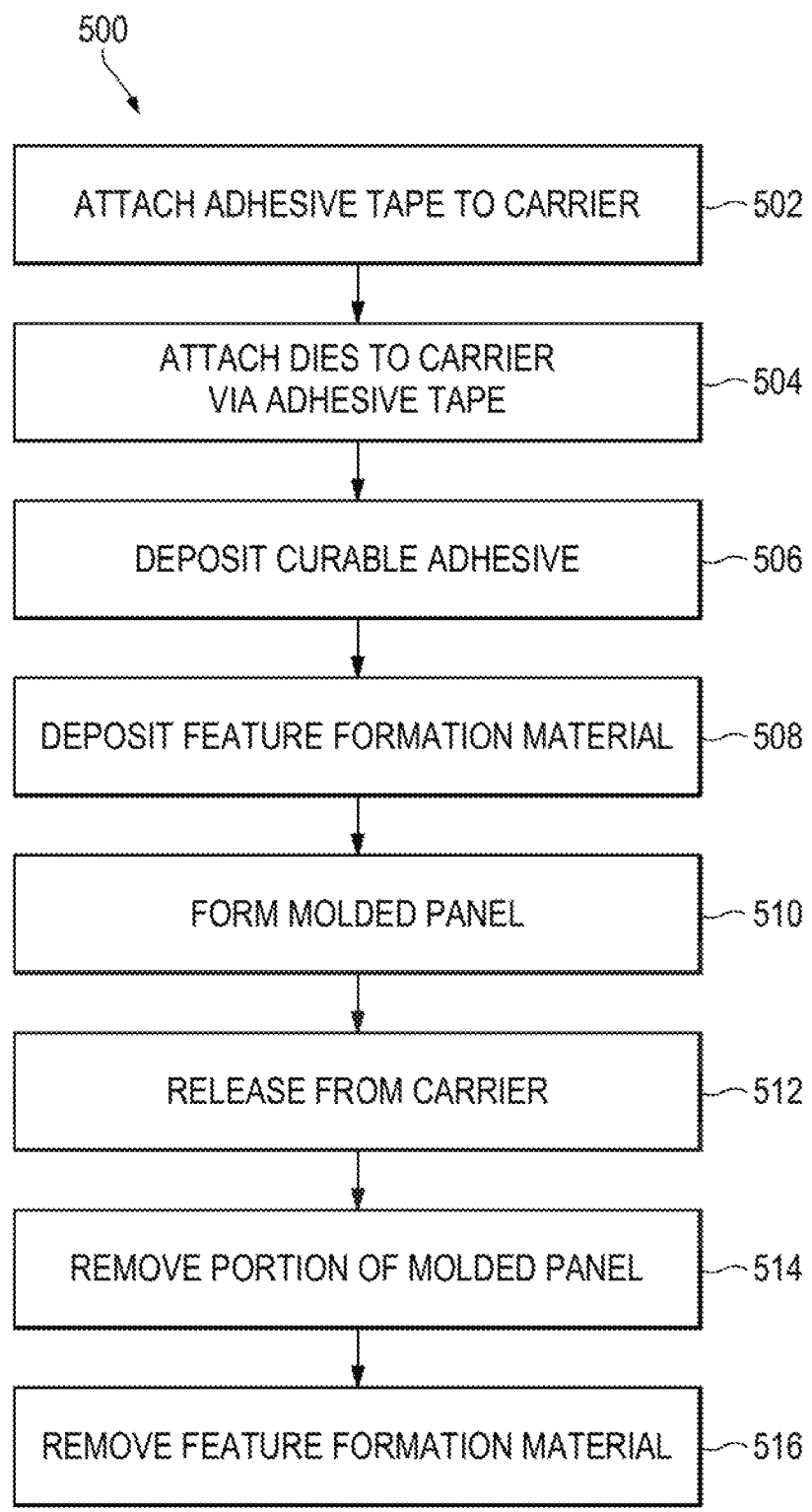
FIG. 10 is a flow diagram of an example process to form an example device.

FIG. 10 provides a flowchart that illustrates an example process 500 for fabricating an example device. In this example, adhesive tape is attached to a carrier (block 502), and the integrated circuit dies are attached to the carrier via the adhesive tape (block 504). As will be appreciated, the integrated circuit dies are attached to the carrier in an arrangement corresponding to the device in which the integrated circuit dies are being implemented. In this example, a curable adhesive may be deposited between at least some integrated circuit dies (block 506). The curable adhesive may be deposited between integrated circuit dies to secure a relative positioning between the integrated circuit dies. A feature formation material may be deposited (block 508), where the feature formation material may be deposited in a layout on the carrier and/or integrated circuit dies that corresponds to three-dimensional features to be formed for the device.

Overmold material is deposited on the carrier, integrated circuit dies, and the feature formation material, and a molded panel is formed with the overmold material (block 510). In some examples, the panel may be released from the carrier (block 512). In such examples, the panel may be released from the carrier by detaching the integrated circuit dies from the adhesive tape that temporarily attached the integrated circuit dies to the carrier.

Furthermore, at least a portion of the molded panel is removed (block 514). In some examples, removing a portion of the molded panel may comprise slot-plunge cutting the portion of the molded panel. In other examples, removing a portion of the molded panel may comprise cutting the molded panel with a laser or other cutting device. Furthermore, removing a portion of the molded panel may comprise performing other micromachining processes. In this example, removing the portion of the molded panel exposes feature formation material, and in this example the feature formation material is removed (block 516). Accordingly, in this example, a three-dimensional feature is formed in the molded panel by removal of the feature formation material and removal of the portion of the molded panel.

Figure 11:
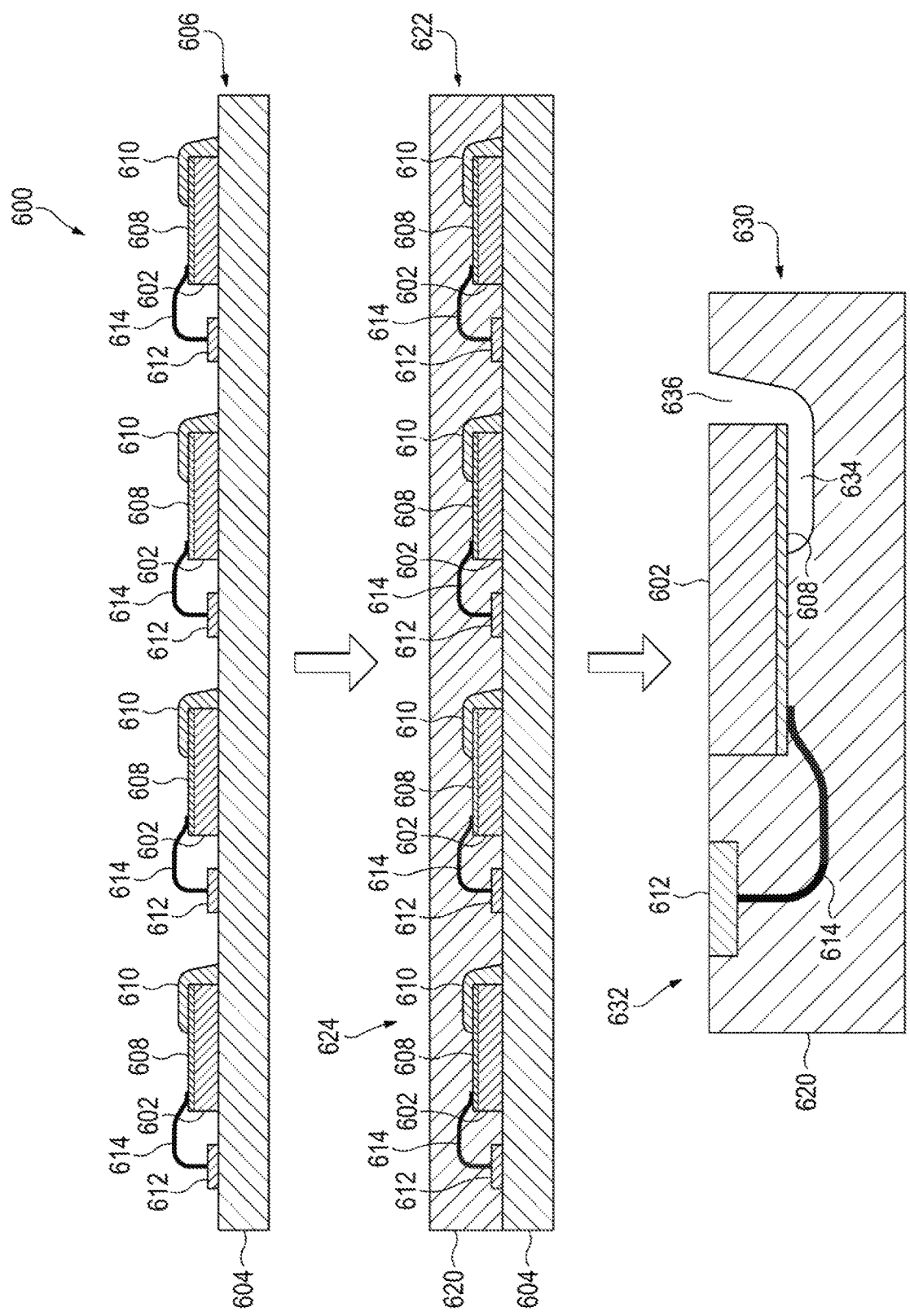
FIG. 11 is a flow diagram of an example process to form an example device.

Turning now to FIG. 11, this figure illustrates a flow diagram of an example process 600 for forming an example device. In this example, a plurality of integrated circuit dies 602 are arranged on a carrier 604 (block 606). In this example, the integrated circuit dies 602 may correspond to sensors that comprise a sensing surface 608. As shown, feature formation material 610 may be deposited on a portion of the sensing surface 608 of each integrated circuit die 602 and on locations of the carrier 604. Furthermore, each integrated circuit die 602 is electrically connected to an electrical contact point 612 (also referred to as a bond pad) via a conductive trace 614. Therefore, as will be appreciated, in this example, each integrated circuit die 602 has a sensing surface 608 and a second surface opposite the sensing surface 608. As shown, in this example, each integrated surface die 602 is removably coupled to the carrier 604 on the second surface.

Continuing the example, an overmold material 620 is deposited over the integrated circuit dies 602, the feature formation material 610, the carrier 604, the electrical contact points 612, and the conductive traces 614, and the overmold material 620 is molded to form a molded panel (block 622). The molded panel is released from the carrier 604, the feature formation material 610 is removed, and the molded panel may be singulated (block 630) to thereby fabricate an example device 632. As shown, by releasing the panel from the carrier and removing the feature formation material, the example device has a three-dimensional feature in the form of a fluid communication channel 634 formed in the overmold material 620 of the molded panel.

As shown, removal of the feature formation material thereby forms an opening 636 in the device 632 fluidly connected to the fluid communication channel. Furthermore, by removing the feature formation material that covered the portion of the sensing surface 608, the portion of the sensing surface 608 is now exposed to the fluid communication channel 634 such that a fluid may be conveyed through the opening 636 to the exposed portion of the sensing surface 608 via the fluid communication channel 634. As will be appreciated, the example device 632 may be connected to a controller or other data processing device via the electrical contact point 612 such that the controller or other data processing device may utilize the example device 632 in fluidic analysis of a sample fluid in contact with the exposed portion of the sensing surface 608. Accordingly, some examples may analyze fluids (e.g., liquids, gasses, etc.) to detect a particular chemical (in gaseous or liquid form) and/or particle in air or other such medium (e.g., a carrier solution, etc.).

FIGS. 12A-B illustrate flow diagrams of an example process 650 for fabricating an example device. Referring to FIG. 12A, in this example, adhesive tape 652 may attach integrated circuit dies 654 to a carrier (block 656). As will be appreciated, the integrated circuit dies 654 of this example comprise fluid ejection dies. As such, the integrated circuit dies 654 each comprise fluid feed holes 658 formed through a first surface and nozzles 660 formed through a second surface, where the fluid feed holes 658 are fluidly connected to the nozzles 660 such that fluid may be conveyed through the fluid feed holes 658 to the nozzles 660 for dispensing thereby. The integrated circuit dies 654 are attached to the carrier 670 via the adhesive tape 652 (block 672). In this example, the surface of each integrated circuit dies 654 corresponding to the nozzles 660 is removably attached to the carrier 670. An adhesive 680 is dispensed between the integrated circuit dies 654 (block 682). As will be appreciated, the adhesive 680 dispensed between the integrated circuit dies 654 may facilitate securing a position of the integrated circuit dies 654 relative to each other. In this example, a feature formation material 690 is deposited on the integrated circuit dies 654 and the adhesive 680 (block 692). As shown, the feature formation material is deposited on the surface of each integrated circuit die 654 corresponding to the fluid feed holes 658.

Continuing to FIG. 12B, an overmold material 700 is deposited over the carrier 670, integrated circuit dies 654, and feature formation material 690 (block 702) and molded to thereby form a molded panel 704. As shown, the molded panel 704 includes the integrated circuit dies 654 and the feature formation material 690 molded into the panel 704. A portion of the overmold material 700 of the molded panel 704 is removed (block 710). In this example, removing the portion of the molded panel 704 exposes the feature formation material 690 included in the panel 704. The feature formation material is removed (block 720) to thereby form three-dimensional features in the molded panel 704. In particular, three-dimensional features in the form of fluid communication channels 722 are formed though the molded panel 704, where the fluid communication channels are in fluid communication with the nozzles 660 of the integrated circuit dies 654 via the fluid feed holes 658. After forming the three-dimensional features, the molded panel 704 is released from the carrier 670 (block 730). Accordingly, when the molded panel 704 is released from the carrier, the nozzles 660 are opened. In this example, the example device of the molded panel 704 may correspond to a fluid ejection device, such as a printhead. As will be appreciated, some example fluid ejection devices may comprise more or less integrated circuit dies and more or less fluid communication channels in fluid communication with more or less integrated circuit dies than the example of FIG. 12A-B.

FIG. 13 provides a flow diagram that illustrates an example process 800 for forming an example device. In this example, integrated circuit dies 802 are arranged on a carrier 804 (block 806). In this example, the integrated circuit dies 802 are electrically connected to an electrical contact point 808 via conductive traces 810, and the conductive traces 810 and electrical connections to the integrated circuit dies 802 are at least partially encapsulated with an insulating material 812.

A feature formation material 820 is deposited in a manner corresponding to a three-dimensional feature to be formed in a molded panel, and an overmold material 822 is deposited and molded over the carrier 804, integrated circuit dies 802, and feature formation material 820 (block 824) to thereby form a molded panel 826. In this example, the feature formation material is deposited over portions of the integrated circuit dies 802 and the carrier 804. The carrier 804 is detached from the molded panel 826, and the feature formation material 820 is removed to thereby form three-dimensional features in the molded panel 826 (block 840). In particular, fluid communication channels 842 are formed in the molded panel 826, where the fluid communication channels 842 are fluidly connected to openings 844 formed in the panel 826 and/or the integrated circuit dies 802.

As illustrated by the examples, forming three-dimensional features in the molded panel with feature formation material may reduce damage caused to integrated circuit dies during fabrication of the example devices. For example, referring to the example of FIGS. 12A-B, by removing the feature formation material to form the portion of the fluid communication channels proximate the integrated circuit dies, the example reduces micromachining interaction with the integrated circuit dies. Particularly, the portion of the molded panel removed by a micromachining process (e.g., slot-plunge cutting, laser cutting, etc.), is spaced apart from the integrated circuit die. Removal of the feature formation material to complete formation of the fluid communication channels may be a less destructive process for the integrated circuit dies molded in the panel.

Accordingly, examples provided herein may provide devices including a molded panel having integrated circuit dies molded therein. In addition, the molded panel has three-dimensional features formed therein, where the three-dimensional features are formed by removing feature formation material deposited in the molded panel. Further examples provide processes for fabricating example devices. Example processes provided herein form three dimensional features in a molded panel by depositing a feature formation material, forming a molded panel that includes the feature formation material, and removing the feature formation material from the molded panel to at least partially form the three-dimensional features in the molded panel.

The preceding description has been presented to illustrate and describe examples of the principles described. This description is not intended to be exhaustive or to limit these principles to any precise form disclosed. Many modifications and variations are possible in light of the description. Therefore, the foregoing examples provided in the figures and described herein should not be construed as limiting of the scope of the disclosure, which is defined in the Claims.

The invention claimed is:

1. A process comprising:
arranging a plurality of integrated circuit dies on a carrier;
depositing a feature formation material on: a portion of an integrated circuit die of the plurality of integrated circuit dies, the carrier, or a combination thereof;

forming a molded panel comprising an epoxy mold compound, the molded panel including the plurality of integrated circuit dies and the feature formation material therein; and removing the feature formation material from the molded panel to thereby form three-dimensional features in the molded panel, the three-dimensional features associated with the plurality of integrated circuit dies;

wherein the plurality of integrated circuit dies are fluid ejection dies, each fluid ejection die comprises a plurality of nozzles, and wherein the removing the feature formation material forms the three-dimensional features in the molded panel corresponding to fluid communication channels that are in fluid communication with the nozzles of the fluid ejection dies, and the molded panel including the fluid ejection dies and having the fluid communication channels formed therein is a fluid ejection device.

2. The process of claim 1, further comprising:

prior to removing the feature formation material, removing portions of overmold material of the molded panel to expose at least a portion of the feature formation material.

3. The process of claim 1, wherein forming the molded panel that includes the plurality of integrated circuit dies and the feature formation material comprises:

depositing an overmold material over the plurality of integrated circuit dies and the feature formation material; and performing an exposed die molding process by compression molding or transfer molding the overmold material over the plurality of integrated circuit dies and the feature formation material to thereby form the molded panel.

4. The process of claim 3, further comprising:

prior to depositing overmold material for forming the molded panel over the plurality of integrated circuit dies, electrically connecting at least one conductive trace to each integrated circuit die, wherein the overmold material is deposited such that the at least one conductive trace electrically connected to each integrated circuit die is at least partially encapsulated by the overmold material to thereby electrically insulate the at least one conductive trace electrically connected to each integrated circuit die.

5. The process of claim 1, further comprising:

detaching the carrier such that a fluidic channel connected to the three-dimensional features is opened on a surface of the molded panel.

6. The process of claim 1, wherein the depositing the feature formation material comprises:

dispensing the feature formation material at least partially on the carrier.

7. The process of claim 1, wherein the depositing the feature formation material comprising depositing a material comprising at least one of a plastic-based material, a metal-based material, an acrylic-based material, or any combination thereof.

8. The process of claim 1, further comprising attaching the plurality of integrated circuit dies to the carrier using an adhesive tape.

9. The process of claim 8, further comprising removing a portion of the molded panel to expose a portion of the feature formation material.

10. The process of claim 9, further comprising releasing the carrier from the molded panel and the plurality of integrated circuit dies.

11. The process of claim 10, wherein removing the feature forming material from the molded panel forms openings in a surface of the molded panel that is parallel with a surface of the plurality of integrated circuit dies.

12. The process of claim 8, further comprising depositing a curable adhesive between at least some integrated circuit dies of the plurality of integrated circuit dies.

* * * * *